(12) United States Patent
Hayes

(10) Patent No.: US 6,980,937 B2
(45) Date of Patent: Dec. 27, 2005

(54) METHOD AND SYSTEM FOR QUANTIFYING THE STEP PROFILE CHARACTERISTICS SEMICONDUCTOR FEATURES USING SURFACE ANALYSIS DATA

(75) Inventor: Timothy S. Hayes, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 742 days.

(21) Appl. No.: 10/011,102

(22) Filed: Dec. 7, 2001

(65) Prior Publication Data

US 2003/0108235 A1    Jun. 12, 2003

(51) Int. Cl.[7] .............................................. G06F 7/60
(52) U.S. Cl. ........................ 703/2; 356/635; 382/145
(58) Field of Search .................... 703/2; 356/626, 356/630, 634–636; 382/145–147

(56) References Cited

U.S. PATENT DOCUMENTS

| | | | |
|---|---|---|---|
| 5,283,442 A | 2/1994 | Martin et al. | |
| 5,345,309 A | 9/1994 | Wertz et al. | |
| 5,877,092 A | 3/1999 | Lee et al. | |
| 5,939,765 A | 8/1999 | Zheng et al. | |
| 6,000,281 A | 12/1999 | Burke | |
| 6,009,255 A | 12/1999 | Shinzawa | |
| 6,034,409 A | 3/2000 | Sakai et al. | |
| 6,096,629 A | 8/2000 | Tsai et al. | |
| 6,181,411 B1 * | 1/2001 | Harris et al. | 356/4.01 |
| 6,392,749 B1 * | 5/2002 | Meeks et al. | 356/634 |
| 6,405,153 B1 * | 6/2002 | Fiekowsky | 702/172 |
| 6,476,398 B1 * | 11/2002 | Xu et al. | 250/396 R |
| 6,563,586 B1 * | 5/2003 | Stanke et al. | 356/445 |
| 6,849,363 B2 * | 2/2005 | Ohashi et al. | 430/5 |

OTHER PUBLICATIONS

Bradley, et al., IBM Technical Disclosure Bulletin, Vol. 28, No. 8, Jan., 1986 "Via Sidewall Shaping by Projection Image Degradation".

G.M. Gut, et al., Research Disclosure, No. 299, Mar., 1989 "Sidewall Angle Reduction of Silicon Features on Semiconductor Wafers".

* cited by examiner

Primary Examiner—Albert W. Paladini
(74) Attorney, Agent, or Firm—William D. Sabo, Esq.; McGinn IP Law Group, PLLC

(57) ABSTRACT

A method and system for quantifying profile characteristics of semiconductor devices, including receiving profile data for a device under evaluation and isolating from the profile data a region indicating a profile edge. The profile edge data is rotated by ninety degrees to become rotated profile edge data. The non-rotated profile edge data or rotated profile edge data is then used to calculate at least one geometric parameter describing the profile edge.

20 Claims, 6 Drawing Sheets

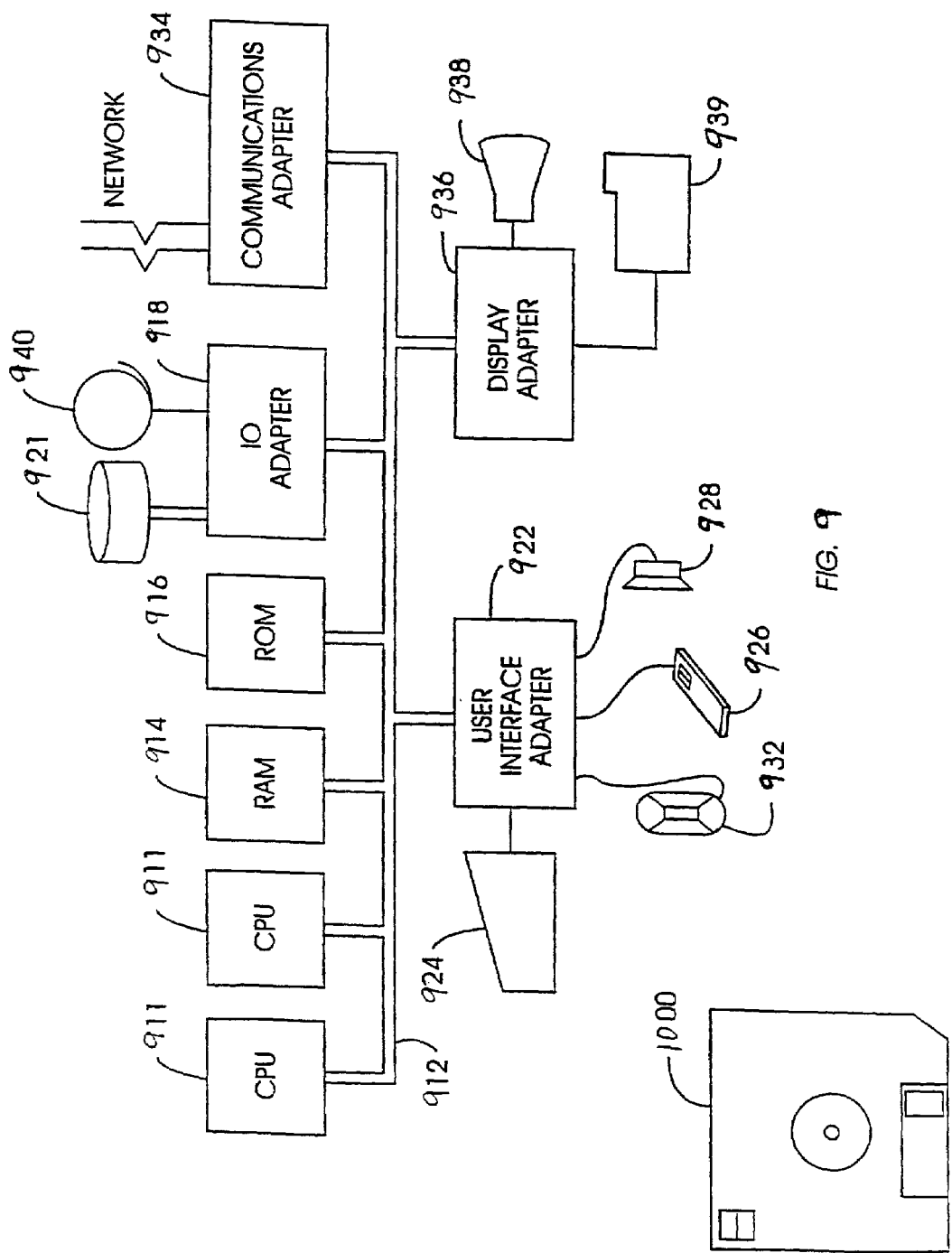

METHOD AND SYSTEM FOR QUANTIFYING THE STEP PROFILE CHARACTERISTICS SEMICONDUCTOR FEATURES USING SURFACE ANALYSIS DATA

DESCRIPTION

BACKGROUND OF THE INVENTION

1. Field of the Invention

The present invention generally relates to tools for fabrication of electronic chips. Specifically, the technique provides for rapid quantification of critical profile characteristics for advanced semiconductor process monitoring and control.

2. Description of the Related Art

Conventional semiconductor wafer processing technology is rapidly developing structures such as lines, spaces, contacts, bars, vias, etc., with dimensions less than 130 nm. The edge, or profile, structural component at these dimensional tolerances becomes a significant percentage of the overall feature. At these dimensions, characteristics of the profile of an edge of any given feature may have severe impact on further processing or more importantly the final electrical response of devices and wiring.

FIG. 1 shows a typical conventional wafer with multiple chips fabricated thereon. As is well known in the art, a multitude of process steps during fabrication of semiconductor devices involve patterning of the various film stacks present on a substrate wafer. These patterns have many feature types including, but not limited to, lines, spaces, vias, contacts, studs, bars, and troughs. Although all of the features on a semiconductor wafer have a three dimensional structure, for larger feature geometries, only two-dimensional metrology is needed for process control.

Lithographic extension has resulted in production of sub-130 nm features. At these feature dimensions, the surface morphology, or surface characteristics, becomes a greater percentage of the bulk volume of the feature. Therefore, controlling these characteristics becomes critical for maintaining stable processes and reliable devices.

Control of semiconductor wafer processes has also evolved to include characteristics of profile as part of critical dimension specifications. That is, characteristics such as sidewall angle, corner rounding, edge roughness, and linearity are being used qualitatively to determine appropriate process window definitions. The current process typically involves taking a physical cross-section or using an atomic force microscope (AFM) equipment to obtain images after various process steps. Engineers use the images to determine the process space and the necessary process conditions to produce the desired effect. In-line quantitative process controls are limited by two-dimensional (top down) metrology which does not allow for full characterization of the process step. Therefore, only gross deviations from the process window are detected with respect to profile characteristics. Detailed analysis always requires engineering involvement with scrutiny over physical cross sections and three-dimensional imaging equipment data. This is an expensive and time-consuming task.

The most widely encountered features from a wafer processing stand point are the line, space, and contact hole (similar to a via). All three of these components contain edges (profiles). However, the orientation of the profile is different depending on the exact three dimensional structure being evaluated. A three dimensional representation of a line and space, as wells as profiles of edges across both features, is shown in FIG. 2 depicting the geometric differences of otherwise identical edges. A contact hole, not depicted, is simply a short axisymmetric space.

For simplicity, a left-handed profile (LH profile) is defined as a profile where the z-height increases as position moves from left to right. For a line feature, FIG. 2 (regions ABCD and EFGH), an example LH profile would be both the edges defined by regions AB and EF. More simply stated, a LH profile is the left hand side of the line as viewed in cross section. For an area such as a via, LH profile is the right hand side of the space.

In the semiconductor fabricator, meaning herein, for example, as either the process of fabricating semiconductor chips or the actual facility that does the fabrication process, three dimensional imaging (or inferencing) equipment such as the atomic force microscope (AFM), Scanning Electron Microscope (SEM), Scatterometer, and Transmission Electron Microscope (TEM) are used to qualitatively assess feature geometries beyond currently controlled parameters such as linewidth critical dimensions (CD) and film thicknesses. As previously mentioned, as features keep getting smaller, the edge component of a line is a greater percentage of the bulk structure. Characteristics such as sidewall angle (SWA), corner rounding, profile roughness (i.e. standing waves), etc., are common examples of what lithography and etch engineers are interested in controlling. However, engineering process window definitions are generally the only application for three dimensional imaging equipment due to the slower information acquisition times. Faster two dimensional imaging equipment is then used for process controls.

Recent breakthroughs in three dimensional metrology equipment are bringing forth tools that operate faster As a result, semiconductor process engineers will be able to obtain more three dimensional images for engineering analysis and process control. However, there currently are no quantitative metrology algorithms for determining critical feature characteristics. This invention provides a software analysis system that utilizes profile data to determine critical parameters that will extend process control capabilities into the future semiconductor device ground rules.

SUMMARY OF THE INVENTION

In view of the foregoing and other problems of the conventional methods, it is, therefore, an object of the present invention to provide to metrology systems capable of outputting profiles of physical structures a structure and method for efficient numerical analysis of profile shape.

It is another object of the present invention to provide an automated quantification of parameters in profile analysis, including as examples, sidewall angle, top rounding, bottom rounding, percent linearity, and sidewall roughness.

It is another object of the present invention to provide a method to analyze multiple linear regions of stepped profiles.

It is another object of the present invention to provide a quantitative analysis producing an output that can be correlated to other fab process metrics for cause and effect analysis.

It is another object of the present invention to provide a software module that can be added to existing metrology packages of common profile instruments or used as a standalone module.

It is another object of the present invention to provide data from a metrology analysis package with output data that can be sent in text or spreadsheet format for additional analysis.

The methodology developed of the present invention describes a technique for rapidly quantifying critical characteristics of profile for advanced semiconductor process monitoring and control.

This invention describes exemplarily one particular component of feature surfaces, namely the profile, or edge. Edges are the side of a three dimensional structure and a profile is the dimensional trace of the edge. Using the coordinate systems as defined in FIG. 1, a profile is the trace across a feature showing the change in height (z) as a function of displacement (x or y). Although the following description uses only the x axis designation, it should be apparent to one of ordinary skill in the art that the techniques described apply as well to the y axis, or a coordinate axis combining x-y, or any coordinate system that can be converted into the xyz coordinate system to describe height as a function of displacement.

The present invention teaches that the data of metrology systems capable of outputting profiles of physical structures can be subjected to numerical analysis to quantify the profile shape. Exemplary information added by numerical analysis of the present invention include sidewall angle, top rounding, bottom rounding, percent linearity, and sidewall roughness. The analysis can be applied to stepped profiles where multiple linear regions exist. The quantitative results of the analysis of the present invention can be correlated to other fab process metrics for cause and effect analysis, thereby providing an additional efficient tool for overall process control.

The analysis technique of the present invention can be incorporated into any number of system metrology packages. As examples, the algorithm could be integrated into the metrology software package for an atomic force microscope, a scanning electron microscope (all SEMs capable of tilted sample or tilted beam analysis), scatterometry, and a profilometer. The present invention could also be implemented as standalone metrology software for integration of the algorithm in systems metrology package. Either as integrated into an existing metrology package or as a standalone software package, the present invention could provide output data to be sent in text or spreadsheet format for additional analysis or presentation related to the overall fabrication process.

In order to achieve the above objects, according to a first aspect of the present invention, described herein is a method for quantifying profile characteristics of semiconductor devices, including receiving profile data for a device under evaluation, isolating from the profile data a region indicating a profile edge, rotating by ninety degrees the data of the isolated profile edge region to become rotated profile edge data, and calculating a value of at least one geometric parameter describing the profile edge.

According to a second aspect of the invention, described herein is a system to quantify profile characteristics of semiconductor devices, including a memory for receiving and storing profile data for a device under evaluation, an isolation calculator receiving as input the stored profile data, calculating a region indicating an isolated profile edge, and providing as output data representing the isolated profile edge, a rotation calculator receiving as inputs the isolated profile edge data, rotating the isolated profile edge data by ninety degrees, and providing as output the rotated profile edge data; and a parameter calculator receiving as input at least one of the rotated profile edge data and the non-rotated profile edge data and calculating at least one geometric parameter describing the isolated profile edge.

According to a third aspect of the present invention, described herein is a signal-bearing medium tangibly embodying a program of machine-readable instructions executable by a digital processing apparatus to perform a method of quantifying profile characteristics of semiconductor devices, where the instructions include receiving profile data for a device under evaluation, isolating from the profile data a region indicating a profile edge, rotating by ninety degrees a data of the isolated profile edge region to become rotated profile edge data, and calculating a value of at least one geometric parameter describing the profile edge.

BRIEF DESCRIPTION OF THE DRAWINGS

The foregoing and other objects, aspects and advantages will be better understood from the following detailed description of an exemplary embodiment of the invention with reference to the drawings, in which.

DETAILED DESCRIPTION OF AN EXEMPLARY EMBODIMENT OF THE INVENTION

Figure 1:
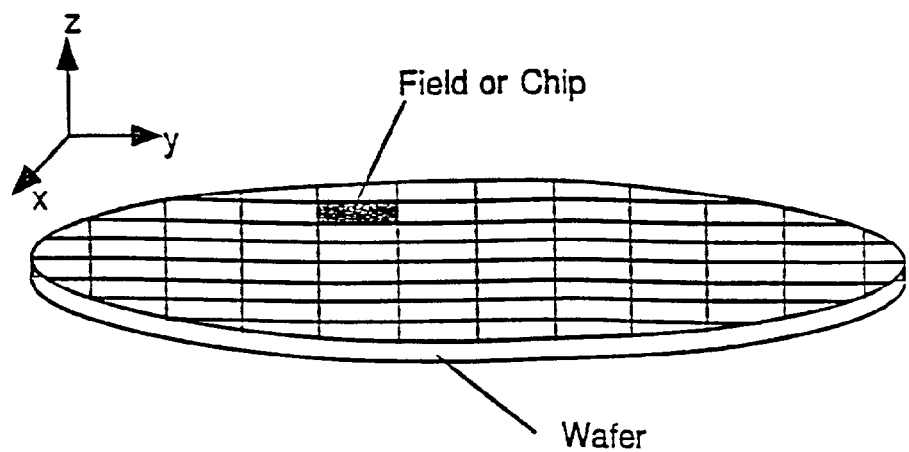
FIG. 1 is a schematic representation of a semiconductor wafer that illustrates the reference coordinate system.
Figure 2:
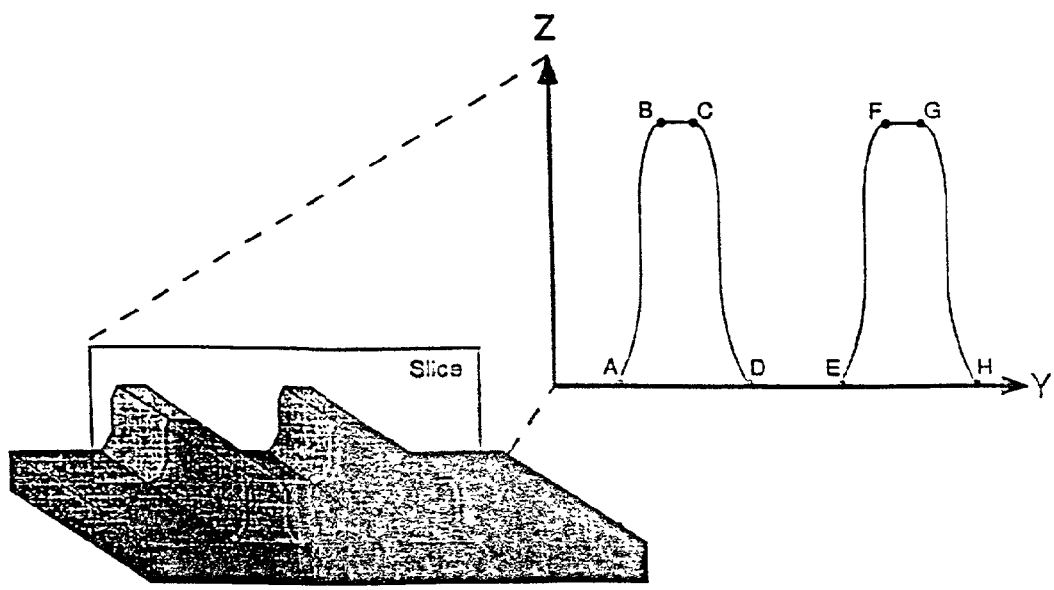
FIG. 2 is a representation of two lines and the space therebetween on a semiconductor wafer.
Figure 3:
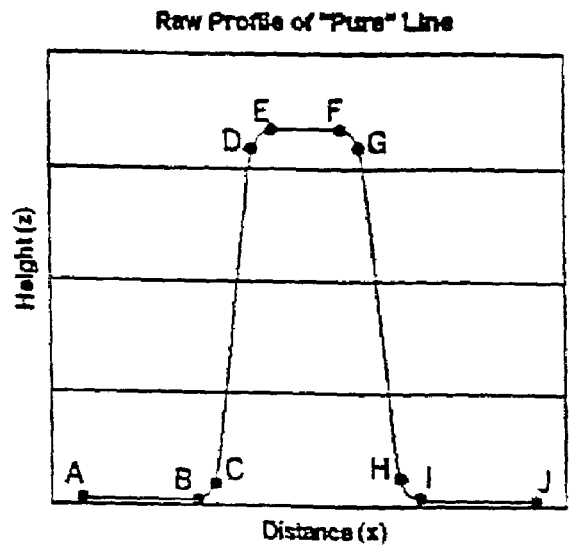
FIG. 3 shows a representation of a pure profile showing points A–J indicating specific inflection points.

Referring now to the drawings, and more particularly to FIG. 3, an algorithm used to evaluate an LH or RH profile is described. As an example, an LH profile is quantified from a line profile, as shown in FIG. 3, by first determining what regions are the background (regions A–B and E–F) and what region is part of the edge (region B–B). The metrology equipment will generate a profile that can be assumed to comprise the region A–F from the data shown in FIG. 3. For this work, a spatial averaging technique is utilized to remove the baseline data. However, many techniques can be employed with equal success.

For example, starting at point "A" a user-defined odd number of data points are selected bounding the point. For example, if five data points are used, then two data points to the left of the data point and two data points to the right of the data point are used for the analysis. The average height of the five data points is determined. Next, the reference data point is moved one pixel (next data point) to the right and the process is repeated. A user defined tolerance (e.g., angstroms, Å) and tolerance factor (e.g., number of consecutive)

data points are used to signify when the region being evaluated is no longer part of the baseline.

For example, assuming a tolerance of 50 Å and a tolerance factor of 3 is used, as the spatial averaging reference point is moved to the right in FIG. 3, at a critical point "B" the average of the spatial reference will exceed the tolerance and the next two spatial reference points will also exceed the tolerance. There may exist a spatial reference point between points "A" and "B" that exceeds the tolerance. However, the tolerance factor allows only consistent increases in height to be detected.

The first point at which the spatial reference exceeds the user defined tolerances marks the point at which the edge begins. The exact process is utilized to remove the top baseline by starting at point "F" and moving to the left until point "E" is recognized. The user may define different averaging factors, tolerances, and tolerance factors for the top and bottom baselines to account for process variability between the different films present on the sample being analyzed. The removal of the baseline data results in LH profile shown in FIG. 4.

Data fitting for edge profiles typically cannot be used due to the large variability in the types of profiles that are encountered in semiconductor processing. Common profiles like the one shown in FIG. 4 could be fitted to polynomial or trigonometric shapes and parameters. However, it is difficult to extract important information such as top and bottom rounding as well as sidewall angle. The preferred, and perhaps only, way to extract information regarding particular regions of interest is to utilize a derivative approach.

Figure 4:
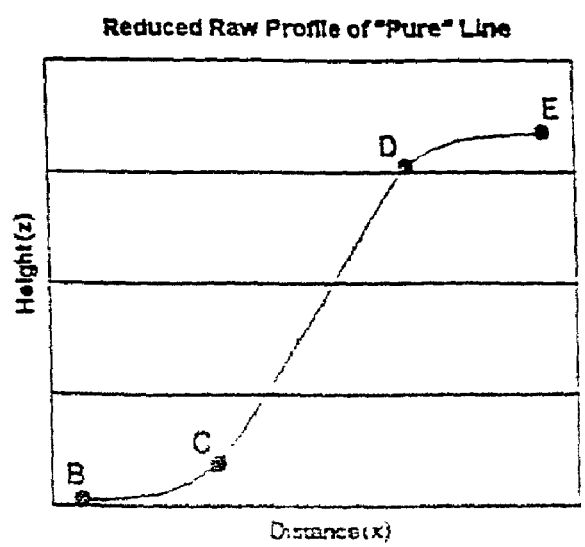
FIG. 4 shows a LH profile produced by stripping the baseline information from the line shown in FIG. 3.
Figure 5:
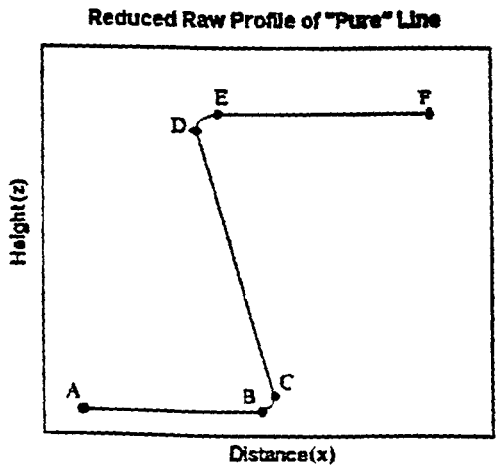
FIG. 5 shows an exemplary LH profile with a recursive (>90°) side wall angle)

Applying a derivative dz/dx (i.e., a change in height as a function of spatial distance) analysis of the profile in FIG. 4 could yield all of the necessary inflection points to extract the information needed. However, if instead the profile were similar to that represented in FIG. 5, a derivative dz/dx could not be utilized since there is not a unique set of z values for each spatial point x.

This problem is solved by rotating the coordinate system or by simply applying the derivative dx/dz, since either rotating the coordinate system or evaluating the differential dx/dz provides the same information. Thus, by determining whether an edge profile is recursive and by rotating the coordinate system as appropriate, all common profiles resulting from semiconductor device fabrication can be quantified. Determination of recursiveness can be done by any number of methods, including as examples, a determination that the angle of the slope exceeds 90°, a determination that multiple z values exist, a calculation of an inflection point and its sign to determine whether the curve region is concave up or concave down, or an evaluation of the signs and values of the dx and dz components. However, in a preferred exemplary implementation of the invention, there is no determination of recursiveness prior to rotation, since a rotated edge profile will provide meaningful calculations independent of recursiveness.

Figure 6:
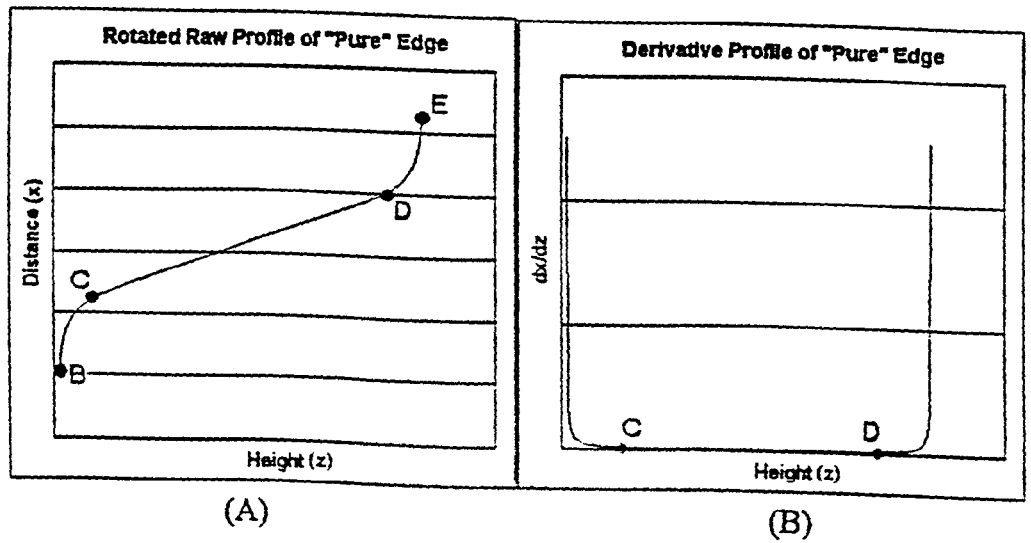
FIG. 6 shows the LH profile produced by rotating the profile shown in FIG. 4 (left side) and the derivative of the rotated profile (right side)

Returning to the example profile shown in FIG. 3, in FIG. 6 is shown the profile after coordinate system rotation (A) and derivation (B). The derivative is generated by starting at point "B" and utilizing a similar user-defined spatial factor as previously described as part of removing the baseline. The derivative factor is used to determine the number of pixels bounding the reference data point for which a slope will be calculated. The slope is determined using any linear regression calculation, such as a least squares fit. The user-defined derivative tolerance (percentage) is set so that when the spatial reference point moves from left to right, the point "C" is indicated when more than the user defined derivative tolerance factor point, are within the derivative tolerance. For example, if the user defined derivative tolerance and derivative tolerance factor are 1% and 3, respectively, the point "C" would be determined when three subsequent spatial reference pixels have the same slope within the 1% tolerance. The point "D" is determined in the same manner as point "C" only the spacial reference point begins at point "E" and moves from right to left. The points A, B, C, and D were all determined as part of the baseline removal and profile derivative processes described previously.

Figure 7:
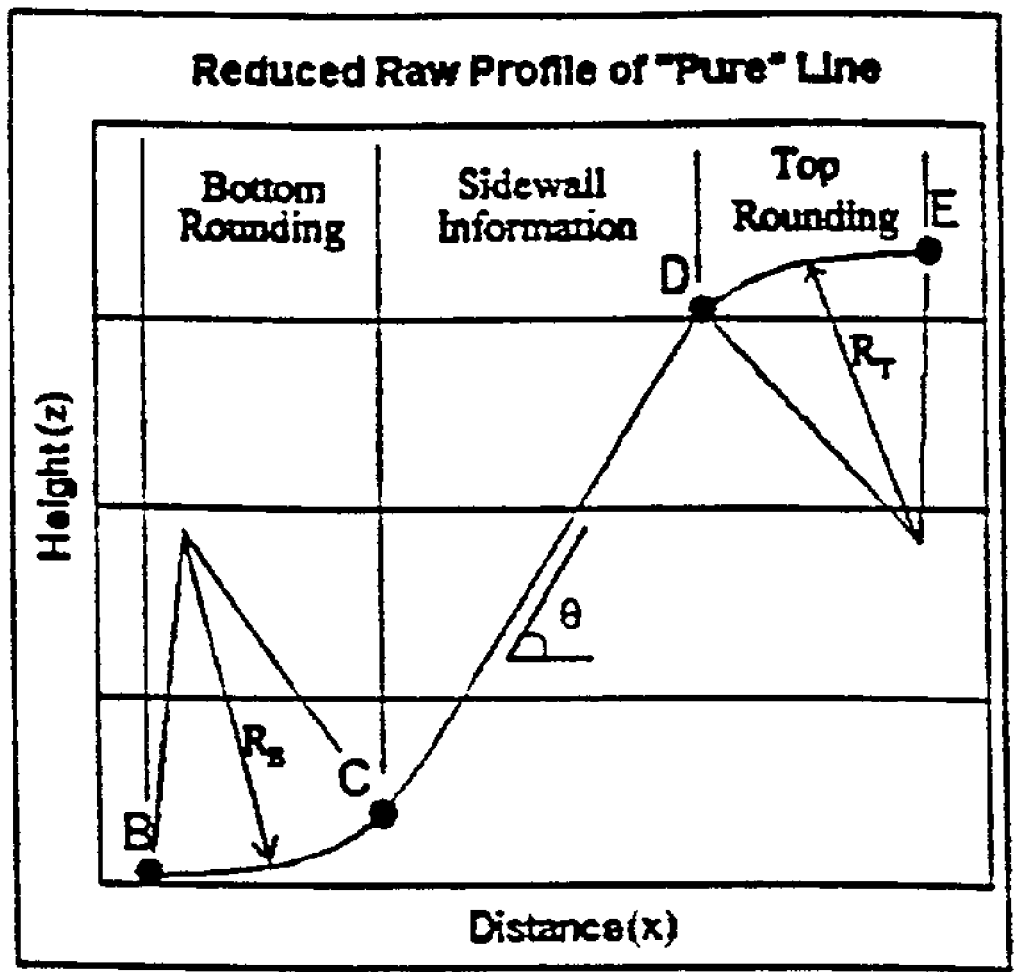
FIG. 7 shows the regions used to determine information about the LH profile shown in FIG. 4.

The coordinates from each of those critical points are used to calculate specific information about the edge profile, as shown in FIG. 7. Rounding is defined as the radius of curvature of transition between the baseline and the sidewall. The equation of a circle in xz space is $$R^2=(x-h)^2+(z-k)^2 \qquad \text{Eq.(1)}$$

where the coordinate pair (h,k) represents the geometric center of the circle that has radius R. In order to determine h, k, and R, three coordinant pairs (x,z) are required. As shown in FIG. 7, for the bottom rounding there already exists two coordinate pairs B(x,z) and C(x,z) and for the top rounding there exists pairs D(x,z) and E(x,z). A third data point is arbitrarily chosen as the point precisely between points B and C. The three data points can then be used to determine the radius of curvature. The same logic applies to the top rounding.

Not all profiles will be smooth like those depicted in FIGS. 3 through 7. A user defined rounding factor can be employed to accommodate for profile roughness. The rounding factor can be chosen to be any integer greater than 1. The number of coordinate pairs along the profile in the region of rounding is then two more than the user defined rounding factor. A more accurate average radius of curvature can be calculated from the radii of curvature determined from each unique set of three coordinate pairs. Top rounding is computed in the exact same fashion as bottom rounding only the region of interest is bound by points D and E.

The linear portion of the sidewall, defined by the region bound by points C and D in FIG. 7, is another major area of interest because this region defines the volume of semiconductor features. An important characteristic of the sidewall is the angle. The sidewall angle is calculated based on simple trigonometry where q is given by $$\theta=\tan^{-1}(\Delta z/\Delta x) \qquad \text{Eq.(2)}$$

The value of q will become negative for recursive sidewalls so the reported angle must be described as:

$$\theta=180+\theta \text{ calc} \qquad \text{Eq.(3)}$$

In addition to the sidewall angle, other quantities are of interest, such as, for example, sidewall roughness and the percent linearity. Sidewall roughness is calculated as the residual error of the best fit line through the profile data between points C and D. Any linear regression technique may be employed. However, in an exemplary embodiment, a standard least squares technique is utilized. The percent linearity is determined from the spatial contribution of the linear region of the profile to the overall edge portion of the profile, as shown mathematically below.

$$\% \text{ Linearity}=(\Delta x)_{CD}/(\Delta x)_{BE} \qquad \text{Eq.(4)}$$

Figure 8:
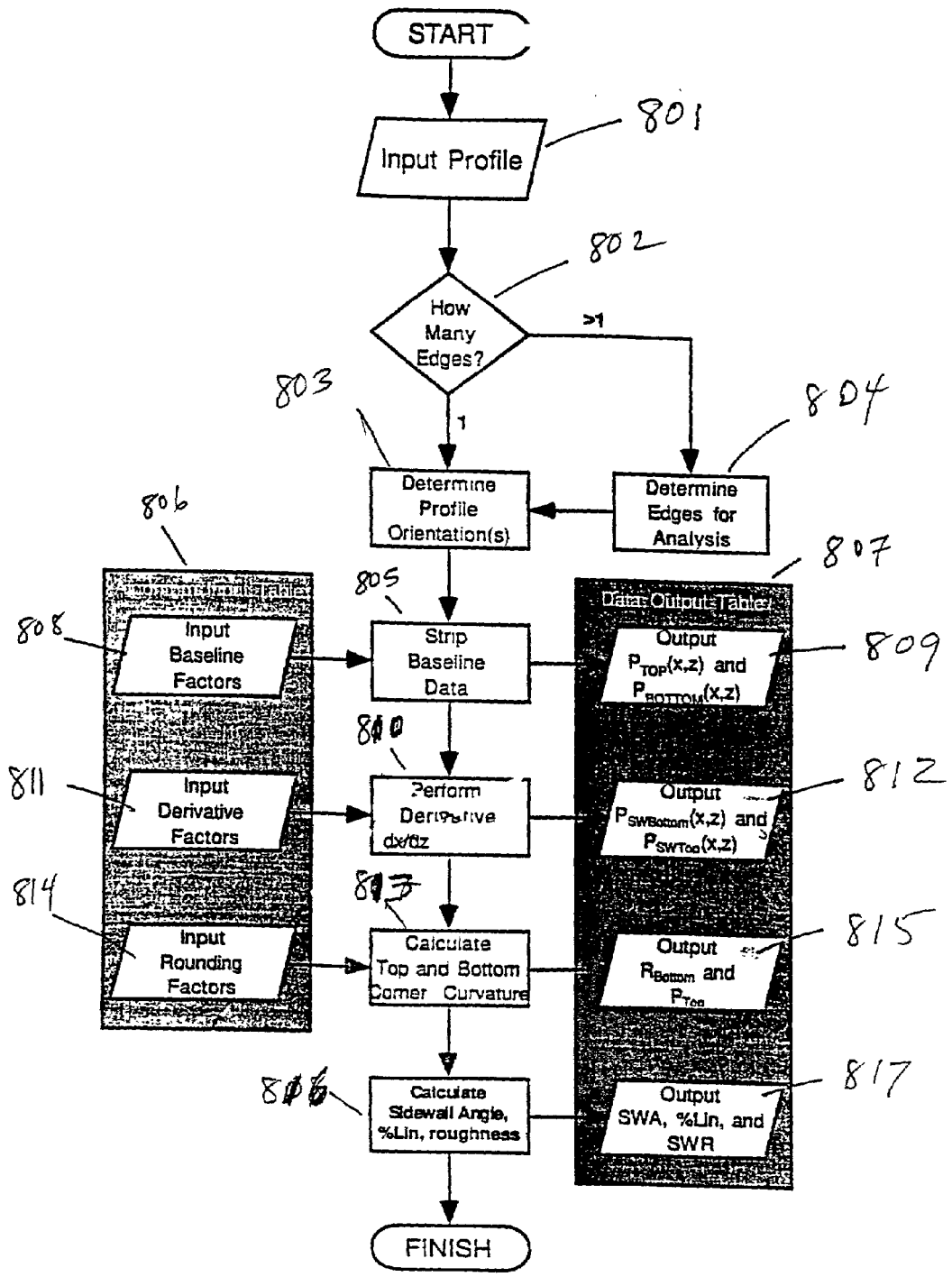
FIG. 8 shows an exemplary embodiment of the steps for calculations of the present invention.
Figure 1:
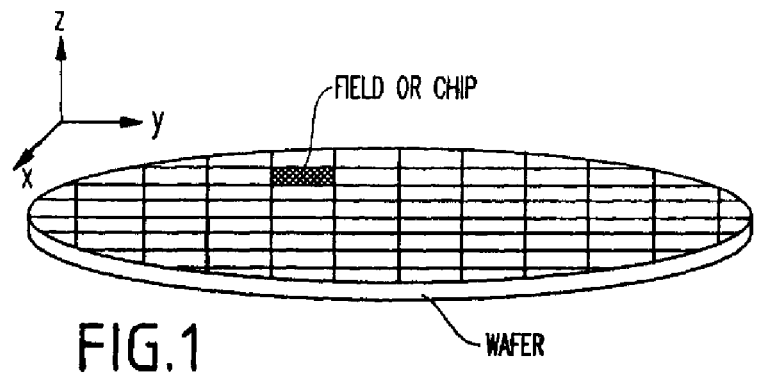
Figure 2:
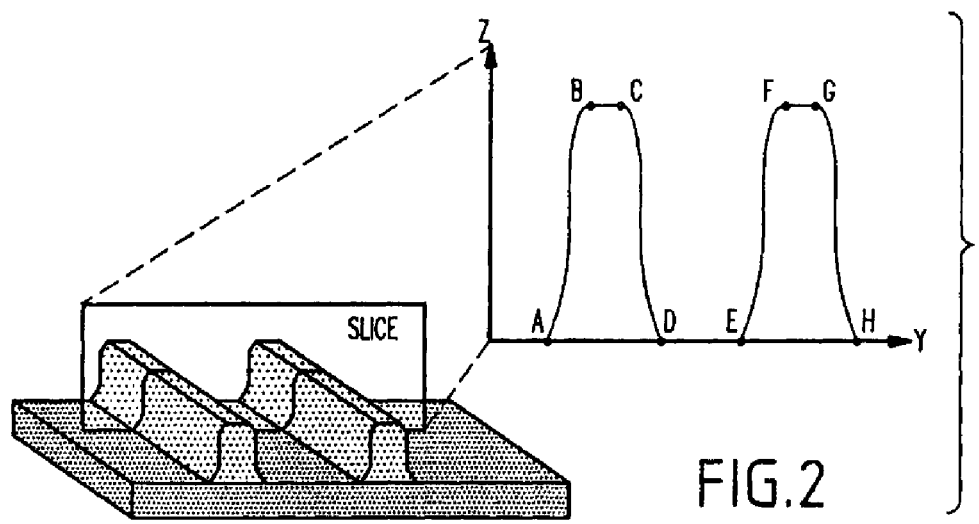
Figure 3:
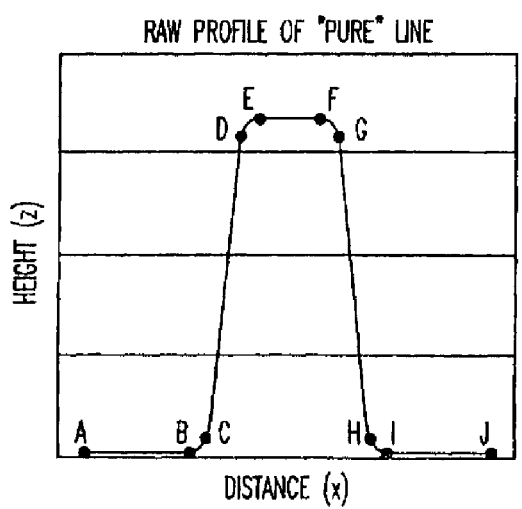
Figure 4:
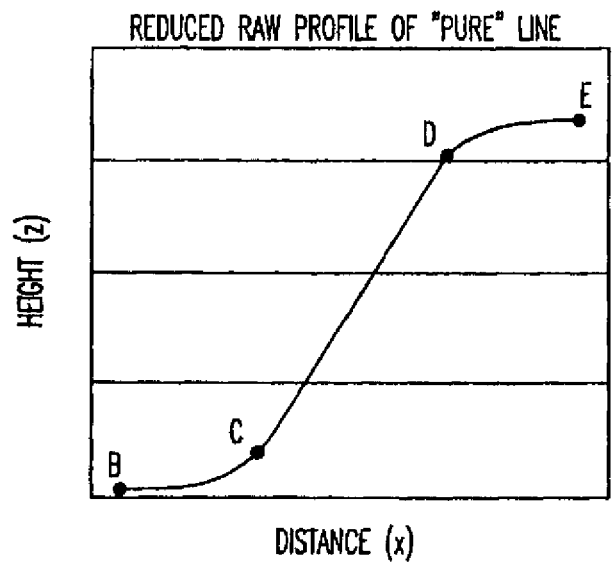
Figure 5:
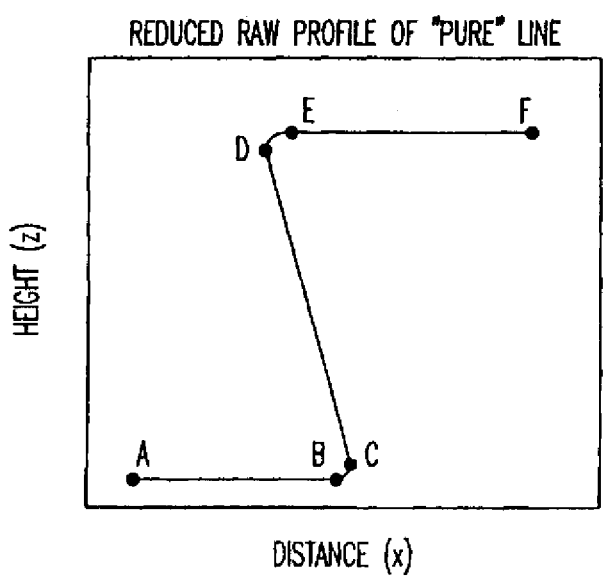
Figure 6A:
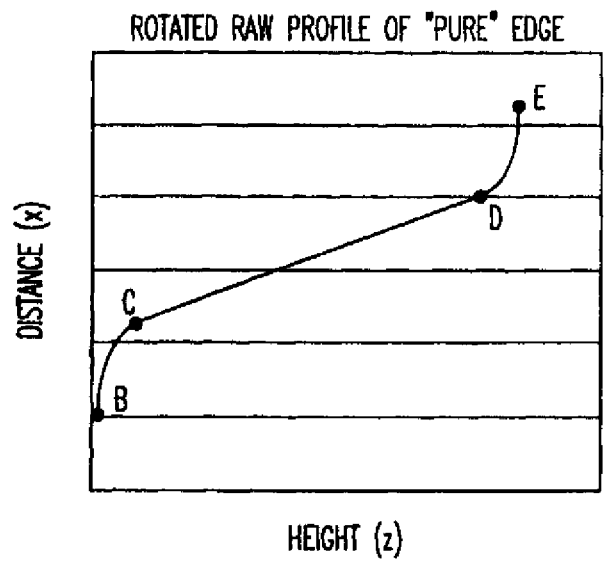
Figure 6B:
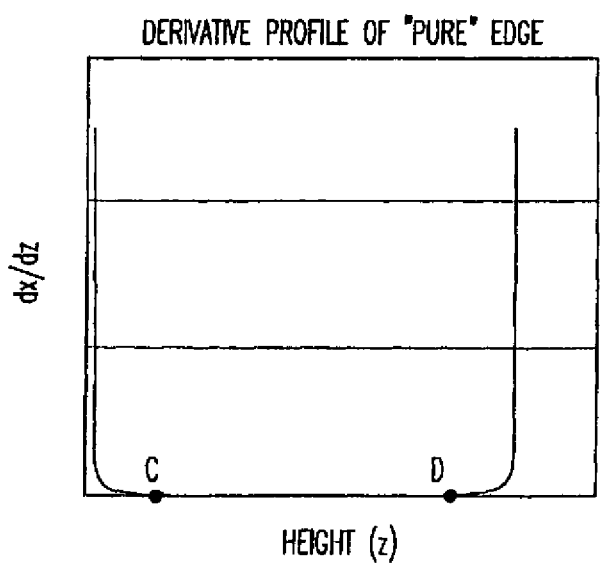
Figure 7:
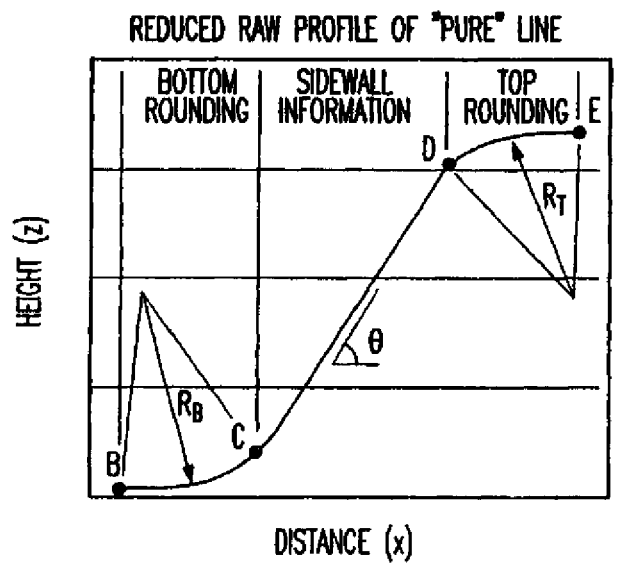
Figure 8:
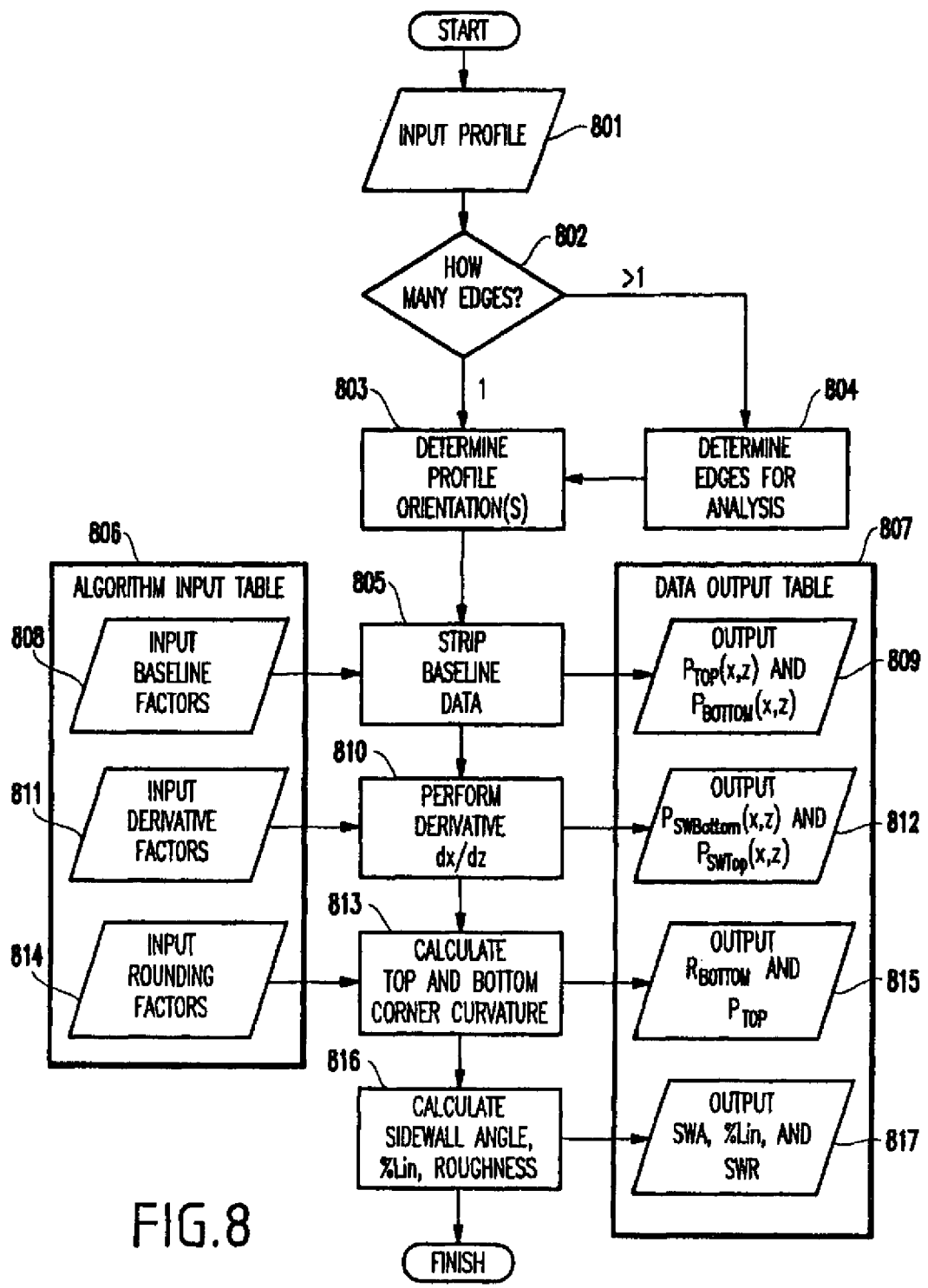

FIG. 8 shows an exemplary embodiment of the steps of the method of the present invention.

In step 801, the metrology system has generated one or more profiles for quantification and the data for the profile(s) is inputed singularity into the quantification algorithm for analysis. In step 802, the appropriate baseline analysis is performed on the input profile and the total number of edges is calculated. The user interface for the algorithm would include a specification for the number and type of edges to be analyzed. Input of data could be done either prior to or concurrent with analysis. In step 803, the orientation of the edge(s) is determined as being LH or RH, as based on the definition previously discussed in the background section. Step 804 shows, if multiple edges are incorporated in the metrology tool input, an operator input is used to determine which of the edges is being analyzed. Those edges are then processed in step 803.

In step 805, the baseline data is stripped from the input profile based on the user defined input baseline factors (808) contained in the algorithm input table (806). The start and end points from the edge profile resulting from step 805 are ouputted in step 809 as $P_{Top}$ and $P_{bottom}$ to the data output table (807). The derivative of the edge profile resulting from step 805 is determined in step 810, based on the user define input derivative factors (811) from the algorithm input table (806).

Relative to step 810, there are at least two basic options. In a first exemplary embodiment, rotation of edge profile data is achieved by taking dx/dz for all edge profile, regardless of recursiveness, and calculations proceed on the rotated data. Alternatively, step 810 could include first a determination of recursiveness, with rotation (by calculating dx/dz rather than dz/dx) only for recursive edge profiles. Recursiveness can be determined in a number of ways, including the methods mentioned earlier. The appropriate derivative dx/dz or dz/dx is then calculated in step 810, dependent upon the determination of recursiveness.

The start and end points of the region of the derivative profile, resulting from 810, that is of constant value, is used to output in step 812 the values $P_{SWBottom}$ and $P_{SWTop}$ to the data output table (807).

The coordinates from the outputs (809 and 812) are used with any operator defined input rounding factors (814) to calculate in step 813 the edge top and bottom radius of curvature, $R_{TOP}$ and $R_{BOTTOM}$, which are then outputted to data output table (807). The constant region defined in 812 is further analyzed in step 816 for the outputs 817. As examples, the average value of the derivative is reported over the region (Sidewall Angle), the standard deviation is reported over the region (sidewall roughness), and the spatial percentage in the x direction of the constant region is determined (% linearity).

It is noted that there are many processes in the semiconductor fabricator which would benefit from a functional metrology package implemented according to the present invention. Combination of the basic algorithm described herein with other software modules currently in use in metrology systems would be straight forward. As one example, a number of different approaches might be used to account for signal-to-noise issues in raw data. If a metrology package already uses one of these technique, then that algorithm might be incorporated with the method described herein, for example, as part of the baseline stripping process.

Figure 9:
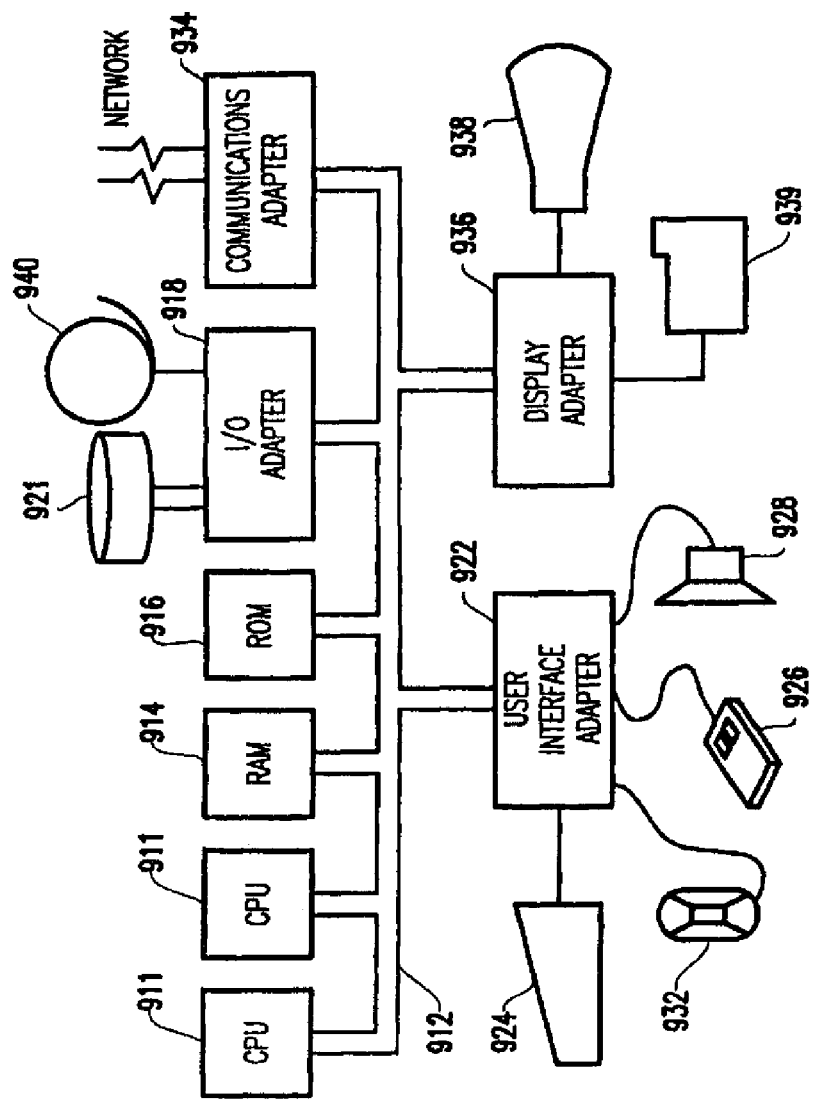
FIG. 9 illustrates an exemplary hardware/information handling system 900 for incorporating the present invention therein.

FIG. 9 illustrates a typical hardware configuration of an information handling/computer system in accordance with the invention and which preferably has at least one processor or central processing unit (CPU) 911.

The CPUs 911 are interconnected via a system bus 912 to a random access memory (RAM) 914, read-only memory (ROM) 916, input/output (I/O) adapter 918 (for connecting peripheral devices such as disk units 921 and tape drives 940 to the bus 912), user interface adapter 922 (for connecting a keyboard 924, mouse 926, speaker 928, microphone 932, and/or other user interface device to the bus 912), a communication adapter 934 for connecting an information handling system to a data processing network, the Internet, an Intranet, a personal area network (PAN), etc., and a display adapter 936 for connecting the bus 912 to a display device 938 and/or printer 939 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 911 and hardware above, to perform the method of the invention.

Figure 10:
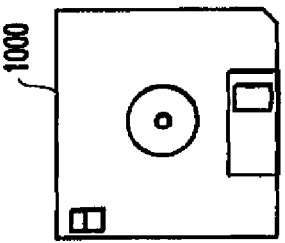
FIG. 10 illustrates a signal bearing medium 1000 (e.g., storage medium) for storing steps of a program of a method according to the present invention.

This signal-bearing media may include, for example, a RAM contained within the CPU 911, as represented by the fast-access storage for example. Alternatively, the instructions may be contained in another signal-bearing media, such as a magnetic data storage diskette 1000 (FIG. 10), directly or indirectly accessible by the CPU 911.

Whether contained in the diskette 1000, the computer/CPU 911, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

While the invention has been described in terms of a single exemplary embodiment, those skilled in the art will recognize that the invention can be practiced with modification within the spirit and scope of the appended claims.

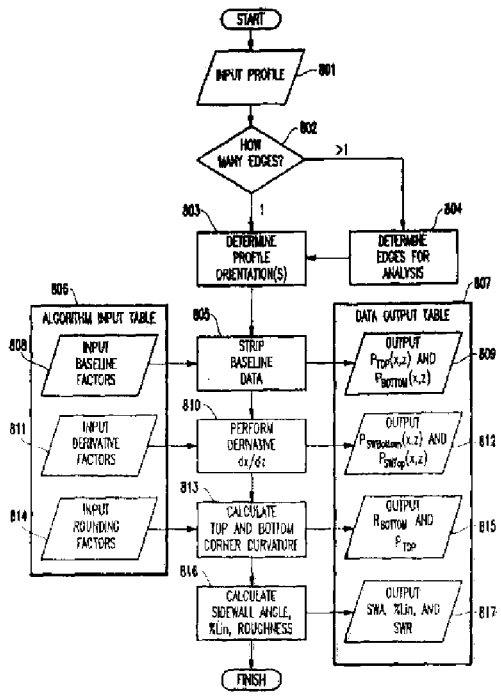

Having thus described my invention, what I claim as new and desire to secure by Letters Patent is as follows:

1. A method for quantifying profile characteristics of semiconductor devices, comprising:
   receiving profile data for a device under evaluation;
   isolating from said profile data an edge profile;
   rotating by ninety degrees a data of said isolated edge profile to become rotated edge profile data; and
   calculating a value of at least one geometric parameter describing said edge profile.

2. The method of claim 1, further comprising:
   determining, prior to said rotation by ninety degrees, whether said edge profile comprises a recursive shape;
   rotating by ninety degrees said data of said isolated edge profile to become rotated edge profile data only if said shape is determined to be recursive; and using one of said non-rotated edge profile data and said rotated edge profile data, as based on said recursive shape determination, for said calculations.

3. The method of claim 1, wherein said rotation comprises a calculation of a derivative dx/dz of said edge profile data, wherein dz comprises a change in a variable z on a z-axis representing a height characteristic of said device and dx comprises a change on an x-axis representing a displacement coordinate relative to said device.

4. The method of claim 1, further comprising:
measuring a vertical height of various points on a surface of said device under evaluation, said vertical height to comprise said profile data for said device.

5. The method of claim 1, wherein said received profile data is derived from a cross sectional image of said device.

6. The method of claim 1, further comprising:
receiving at least one operator input to control or define at least one of said steps.

7. The method of claim 1, wherein said at least one geometric parameter describing said edge profile comprises at least one of the following:
a derivative;
a slope;
an inflection point;
at least one of a start point and an end point of said edge profile;
at least one of an edge top radius of curvature and a bottom radius of curvature;
a sidewall angle;
a sidewall roughness; and
a percent linearity.

8. The method of claim 1, further comprising one or more of the following:
providing said calculated value as an output;
providing said calculated value as an output in a format for additional analysis; and
storing said calculated value as data and performing additional analysis on said stored data.

9. The method of claim 4, wherein said measurement is accomplished by one of:
an atomic force microscope (AFM);
a Scanning Electron Microscope (SEM);
a Scatterometer; and
a Transmission Electron Microscope (TEM).

10. The method of claim 6, wherein said at least one operator input comprises at least one of an averaging factor, a tolerance and a tolerance factor.

11. A system to quantify profile characteristics of semiconductor devices, comprising:
a memory for receiving and storing profile data for a device under evaluation;
an isolation calculator receiving as input said stored profile data, calculating a region indicating an isolated edge profile, and providing as output data representing said isolated edge profile;
a rotation calculator receiving as inputs said isolated edge profile data and rotating said isolated edge profile data by ninety degrees, and providing as output said rotated edge profile data; and
a parameter calculator receiving as input at least one of said rotated edge profile data and said non-rotated edge profile data and calculating at least one geometric parameter describing said isolated edge profile.

12. The system of claim 11, wherein said rotation comprises a calculation of a derivative dx/dz of said edge profile data, wherein dz comprises a change in a variable z on a z-axis representing a height characteristic of said device and dx comprises a change on an x-axis representing a displacement coordinate relative to said device.

13. The system of claim 11, further comprising:
a transducer measuring a vertical height of various points on a surface of said device under evaluation, said vertical height to comprise said profile data for said device.

14. The system of claim 11, further comprising:
an image processor to derive said received profile data from a cross sectional image of said device.

15. The system of claim 11, further comprising:
an operator interface to receive one or more operator inputs to control or define at least one of said calculations.

16. The system of claim 11, further comprising one or more of the following:
an output display;
a calculator to format said calculated value into a format for additional analysis;
a memory to store said calculated value; and
a calculator to perform additional analysis on stored ones of said calculated value.

17. The system of claim 13, wherein said transducer comprises one of:
an atomic force microscope (AFM);
a Scanning Electron Microscope (SEM);
a Scatterometer; and
a Transmission Electron Microscope (TEM).

18. A signal-bearing medium tangibly embodying a program of machine-readable instructions executable by a digital processing apparatus to perform a method of quantifying profile characteristics of semiconductor devices, said instructions comprising:
receiving profile data for a device under evaluation;
isolating from said profile data an edge profile;
rotating by ninety degrees a data of said isolated edge profile to become rotated edge profile data; and
calculating a value of at least one geometric parameter describing said edge profile.

19. The signal-bearing medium of claim 18, wherein said rotation comprises a calculation of a derivative dx/dz of said edge profile data, wherein dz comprises a change in a variable z on a z-axis representing a height characteristic of said device and dx comprises a change on an x-axis representing a displacement coordinate relative to said device.

20. The signal-bearing medium of claim 18, wherein said instructions further comprise at least one of instructions for:
measuring a vertical height of various points on a surface of said device under evaluation, said vertical height to comprise said profile data for said device;
determining whether said edge profile comprises a recursive shape and performing said rotation only if said edge profile is determined to be a recursive shape;
deriving said profile data from a cross sectional image of said device;
receiving at least one operator input to control or define at least one of said steps;
providing said calculated value as an output;
providing said calculated value as an output in a format for additional analysis; and
storing said calculated value as data and performing additional analysis on said stored data.

* * * * *

UNITED STATES PATENT AND TRADEMARK OFFICE
CERTIFICATE OF CORRECTION

| | | |
|---|---|---|
| PATENT NO. | : 6,980,937 B2 | Page 1 of 8 |
| APPLICATION NO. | : 10/011102 | |
| DATED | : December 27, 2005 | |
| INVENTOR(S) | : Hayes | |

It is certified that error appears in the above-identified patent and that said Letters Patent is hereby corrected as shown below:

THE TITLE PAGE, SHOWING AN ILLUSTRATIVE FIGURE SHOULD BE DELETED AND SUBSTITUTE THEREFOR THE ATTACHED TITLE PAGE.

DELETE DRAWING SHEETS 1-6 AND SUBSTITUTE THEREFOR THE DRAWING SHEETS CONSISTING OF FIGS 1-10 AS SHOWN ON THE ATTACHED PAGES.

Signed and Sealed this

Nineteenth Day of May, 2009

JOHN DOLL
*Acting Director of the United States Patent and Trademark Office*

United States Patent
Hayes

(12) United States Patent
(10) Patent No.: US 6,980,937 B2
(45) Date of Patent: Dec. 27, 2005

(54) METHOD AND SYSTEM FOR QUANTIFYING THE STEP PROFILE CHARACTERISTICS SEMICONDUCTOR FEATURES USING SURFACE ANALYSIS DATA

(75) Inventor: Timothy S. Hayes, Colchester, VT (US)

(73) Assignee: International Business Machines Corporation, Armonk, NY (US)

(*) Notice: Subject to any disclaimer, the term of this patent is extended or adjusted under 35 U.S.C. 154(b) by 742 days.

(21) Appl. No.: 10/011,102

(22) Filed: Dec. 7, 2001

(65) Prior Publication Data
US 2003/0108235 A1 Jun. 12, 2003

(51) Int. Cl.[7] ............................................. G06F 7/60
(52) U.S. Cl. ........................... 703/2; 356/635; 382/145
(58) Field of Search .......................... 703/2; 356/626, 356/630, 634–636; 382/145–147

(56) References Cited

U.S. PATENT DOCUMENTS

| | | |
|---|---|---|
| 5,283,442 A | 2/1994 | Martin et al. |
| 5,345,309 A | 9/1994 | Wertz et al. |
| 5,877,092 A | 3/1999 | Lee et al. |
| 5,939,765 A | 8/1999 | Zheng et al. |
| 6,000,281 A | 12/1999 | Burke |
| 6,009,255 A | 12/1999 | Shinzawa |
| 6,034,409 A | 3/2000 | Sakai et al. |
| 6,096,629 A | 8/2000 | Tsai et al. |
| 6,181,411 B1 * | 1/2001 | Harris et al. ............ 356/4.01 |
| 6,392,749 B1 * | 5/2002 | Meeks et al. ............ 356/634 |
| 6,405,153 B1 * | 6/2002 | Fiekowsky ............ 702/172 |
| 6,476,398 B1 * | 11/2002 | Xu et al. ............ 250/396 R |
| 6,563,586 B1 * | 5/2003 | Stanke et al. ............ 356/445 |
| 6,849,363 B2 * | 2/2005 | Ohashi et al. ............ 430/5 |

OTHER PUBLICATIONS

Bradley, et al., IBM Technical Disclosure Bulletin, Vol. 28, No. 8, Jan., 1986 "Via Sidewall Shaping by Projection Image Degradation".
G.M. Gui, et al., Research Disclosure, No. 299, Mar., 1989 "Sidewall Angle Reduction of Silicon Features on Semiconductor Wafers".

* cited by examiner

*Primary Examiner*—Albert W. Paladini
(74) *Attorney, Agent, or Firm*—William D. Sabo, Esq.; McGinn IP Law Group, PLLC

(57) ABSTRACT

A method and system for quantifying profile characteristics of semiconductor devices, including receiving profile data for a device under evaluation and isolating from the profile data a region indicating a profile edge. The profile edge data is rotated by ninety degrees to become rotated profile edge data. The non-rotated profile edge data or rotated profile edge data is then used to calculate at least one geometric parameter describing the profile edge.

20 Claims, 6 Drawing Sheets